United States Patent
Wells

(10) Patent No.: US 7,085,341 B2
(45) Date of Patent: Aug. 1, 2006

(54) COUNTER WITH NON-UNIFORM DIGIT BASE

(75) Inventor: Steven E. Wells, El Dorado Hills, CA (US)

(73) Assignee: Intel Corporation, Santa Clara, CA (US)

( * ) Notice: Subject to any disclaimer, the term of this patent is extended or adjusted under 35 U.S.C. 154(b) by 387 days.

(21) Appl. No.: 10/614,966

(22) Filed: Jul. 8, 2003

(65) Prior Publication Data

US 2004/0107377 A1 Jun. 3, 2004

Related U.S. Application Data

(62) Division of application No. 09/339,012, filed on Jun. 23, 1999, now Pat. No. 6,687,325.

(51) Int. Cl.
*G06M 3/00* (2006.01)
(52) U.S. Cl. ............... 377/26; 377/28; 377/33; 377/34; 365/236
(58) Field of Classification Search ............ None
See application file for complete search history.

(56) References Cited

U.S. PATENT DOCUMENTS

| 4,562,206 A | 12/1985 | Tuttle ............... 574/548 |
| 4,682,287 A * | 7/1987 | Mizuno et al. ....... 702/165 |
| 4,947,410 A | 8/1990 | Lippmann et al. ...... 377/26 |
| 5,181,231 A * | 1/1993 | Parikh et al. .......... 377/26 |
| 5,450,460 A * | 9/1995 | Stodieck .............. 377/44 |
| 6,084,935 A | 7/2000 | Mather ................ 377/33 |
| 6,249,562 B1 | 6/2001 | Wells .................. 377/26 |

OTHER PUBLICATIONS

U.S. Appl. No. 09/477,034, filed Dec. 31, 1999, entitled Non-Volatile Memory Based Monotonic Counter, by Lance W. Doveer and Andrew H. Gafken. USP 6,836853.

U.S. Appl. No. 09/397,175, filed Aug. 23, 1999, entitled Method and System for Implementing a Digit Counter for Flash Memory, By Steven E. Wells. USP 6,249,562.

* cited by examiner

*Primary Examiner*—Tuan T. Lam
(74) *Attorney, Agent, or Firm*—Blakely, Sokoloff, Taylor & Zafman LLP

(57) ABSTRACT

A nonvolatile counter. A nonvolatile storage is organized in digits having non-uniform bases. Circuitry is provided to increment a count value represented by the digits in response to an increment command.

18 Claims, 5 Drawing Sheets

FIG. 2

| COUNT VALUE | DIGIT N | | | | | | | | | | DIGIT 2 | | | | | | | | | | DIGIT 1 | | | | | | | | | |
|---|---|---|---|---|---|---|---|---|---|---|---|---|---|---|---|---|---|---|---|---|---|---|---|---|---|---|---|---|---|---|
| 0  | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 |
| 1  | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 1 |
| 2  | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 1 | 1 |
| 3  | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 1 | 1 | 1 |
| 4  | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 1 | 1 | 1 | 1 |
| 5  | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 1 | 1 | 1 | 1 | 1 |
| 6  | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 1 | 1 | 1 | 1 | 1 | 1 |
| 7  | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 1 | 1 | 1 | 1 | 1 | 1 | 1 |
| 8  | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 1 | 1 | 1 | 1 | 1 | 1 | 1 | 1 |
| 9  | 0 | 0 | 0 | 0 | 0 | 0 | 0 | 0 | 0 | 0 | 0 | 0 | 0 | 0 | 0 | 0 | 0 | 0 | 0 | 0 | 0 | 1 | 1 | 1 | 1 | 1 | 1 | 1 | 1 | 1 |
| 10 | 0 | 0 | 0 | 0 | 0 | 0 | 0 | 0 | 0 | 0 | 0 | 0 | 0 | 0 | 0 | 0 | 0 | 0 | 0 | 0 | 1 | 0 | 0 | 0 | 0 | 0 | 0 | 0 | 0 | 0 |
| 11 | 0 | 0 | 0 | 0 | 0 | 0 | 0 | 0 | 0 | 0 | 0 | 0 | 0 | 0 | 0 | 0 | 0 | 0 | 0 | 1 | 1 | 0 | 0 | 0 | 0 | 0 | 0 | 0 | 0 | 1 |
| ... | | | | | | | | | | | | | | | | | | | | | | | | | | | | | | |
| $10^N - 1$ | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 |

DIGIT COUNTER 22

| COMMAND | FIRST BUS CYCLE | | | SECOND BUS CYCLE | | | THIRD BUS CYCLE | | |
|---|---|---|---|---|---|---|---|---|---|
| | OPER | ADDR | DATA | OPER | ADDR | DATA | OPER | ADDR | DATA |
| READ ARRAY | WRITE | X | XXFFH | READ | AA | AD | — | — | — |
| READ STATUS | WRITE | X | XX90H | READ | X | ST | — | — | — |
| CLEAR STATUS | WRITE | X | XX50H | — | — | — | — | — | — |
| PROGRAM | WRITE | X | XX40H | WRITE | AA | WD | — | — | — |
| BLOCK ERASE | WRITE | X | XX20H | WRITE | BA | XXD0H | — | — | — |
| INCREMENT | WRITE | X | XXC0H | — | — | — | — | — | — |
| COUNTER SETUP | WRITE | X | XX60H | WRITE | BA | DB(1) | WRITE | BA | DB(2) |

61 → INCREMENT
62 → COUNTER SETUP

LEGEND
AA = ARRAY ADDRESS
AD = ARRAY DATA
BA = BLOCK ADDRESS
DB = DIGIT BASE
ST = STATUS
WD = WRITE DATA

FIG. 5

COUNTER WITH NON-UNIFORM DIGIT BASE

This application is a divisional application of application Ser. No. 09/339,012, now U.S. Pat. No. 6,687,325, filed on Jun. 23, 1999, entitled "Counter with Non-Uniform Digit Base", and claims priority therefrom.

FIELD OF THE INVENTION

The present invention relates generally to electronic counters, and more specifically to a non-volatile counter with a non-uniform digit base.

BACKGROUND OF THE INVENTION

Non-volatile counters are used in various electronic applications. One important application for non-volatile counters is in the field of electronic commerce where it is important to order financial transactions in a definite sequence. In such applications it is important that the counting function be robust enough to withstand hardware and/or software failures, including unexpected power loss. It is also important for the counting function to be secure against unauthorized access and tampering.

One technique for providing a counting function that can withstand power loss is to use a battery or similar power supply in conjunction with a binary counter circuit. Unfortunately, battery-backed counters tend to occupy a relatively large amount of circuit or device space and impose high battery costs. Also, batteries are prone to failure and discharge and so must be monitored and periodically replaced to prevent loss of the count data. Further, many binary counters do not allow for easy recovery of count data in the event of count interruption due to power loss.

SUMMARY OF THE INVENTION

A counter is disclosed. The counter includes a nonvolatile storage organized in digits having non-uniform bases and circuitry to increment a count value represented by the digits in response to an increment command.

Other features and advantages of the present invention will be apparent from the accompanying drawings and from the detailed description that follows.

BRIEF DESCRIPTION OF THE DRAWINGS

The present invention is illustrated by way of example and not limitation in the figures of the accompanying drawings, in which like references indicate similar elements, and in which:

FIG. 2 illustrates an exemplary digit counter that includes N base$_{10}$ digits;

FIG. 5 depicts an exemplary list of commands supported by the command nonvolatile memory device of FIG. 4.

DETAILED DESCRIPTION

A counter with a non-uniform digit base is described in various embodiments. In one embodiment, the counter is implemented in a nonvolatile memory device so that the count value is maintained during power loss. The base of each digit in the counter is selected in according to application requirements and characteristics of the nonvolatile memory device.

Figure 1:
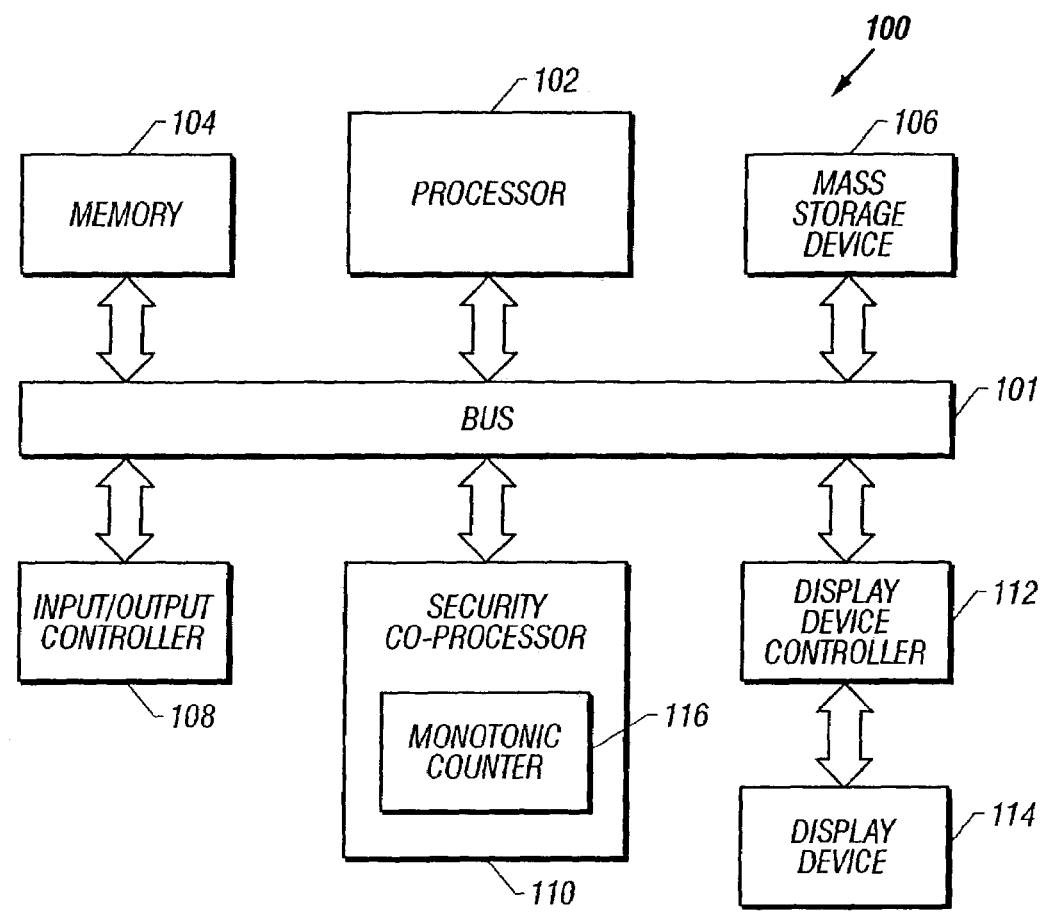
FIG. 1 is a block diagram of a computer system in which a counter according to embodiments of the present invention may be used.

FIG. 1 is a block diagram of a computer system 100 in which a counter according to embodiments described herein may be used. The computer system 100 includes a processor 102 coupled through a bus 101 to a memory 104 and a mass storage device 106. Memory 104 may be random access memory ("RAM"), read-only memory ("ROM"), or other non-volatile memory, such as flash memory. Mass storage device 106 may be a large capacity persistent storage device, such as a hard disk drive, tape drive, or CD-ROM drive. An input/output controller 108 is coupled to bus 101 for receiving commands or data entered through a keyboard, mouse, or similar input device. A display device controller 112 is also coupled to bus 101 for providing output through an appropriately coupled display device 114.

Computer system 100 also includes a security co-processor 110. Security co-processor 110 is an embedded controller that includes digital circuits to execute security programs and perform mathematical transforms for security. Security co-processor 110 includes several circuits that perform security functions, such as authentication circuits and random number generators. Security co-processor 110 also includes counter 116, implemented according to embodiments described herein, to enable authentication and unique identification of the transactions that occur within the system. The ability to authenticate and uniquely identify transactions provides a level of security in protecting the transactions from tampering by unauthorized parties. The monotonic counter 116 may be used in other computer architectures and devices without departing from the spirit and scope of the present invention.

In one embodiment, the counter 116 is a monotonic counter implemented in a flash EPROM (erasable programmable read-only memory). A monotonic counter is a counter that counts in one direction only, up or down. The flash EPROM used to implement the monotonic counter may be integrated with the circuitry for the security co-processor 110 (i.e., on the same chip), or implemented in a separate device. Flash EPROM devices typically use a single-transistor memory cells to store data. The state of a given cell is changed by program (1→) and erase (0→1) operations which may be initiated by processor 102 or by security co-processor 110.

Counters in electronic circuits typically count in binary, with each bit representing a base two digit in the count value. One characteristic of such binary counters is that each bit in the count changes state twice as frequently as the next more significant bit, with the least significant bit in the count changing state with each count increment. In the context of a non-volatile memory, this toggling of the least significant bit significantly limits the count rate that can be achieved because a relatively slow erase cycle is required every other count. For example, for a typical flash memory cell, the program cycle time may be on the order of 10 microseconds, whereas the erase cycle time may be on the order of one second. In this case, the average count rate for the binary counter is limited to approximately one half second per count increment (i.e., (1E−5 sec+1 sec)/2). Such a slow average count rate is inadequate for many types of counting applications.

Another problem that results when a binary counter is implemented in a non-volatile memory is that the frequent programming and erasing of low-order bits may quickly exceed the maximum number of program/erase cycles that can be performed on the memory cell before the cell becomes unusable. For example, in a flash memory device, the continuous programming and erasure of the cells leads to stress and eventual breakdown of the oxide layer in the memory cells. Advanced processing techniques have produced flash EPROM devices that permit on the order of 100,000 program/erase cycles before cells begin breaking down. Thus, the maximum number of program/erase cycles supported by a particular memory device may limit the maximum count of a binary counter implemented in the device and therefore may render the binary counter unsuitable for certain applications.

In one embodiment, the above described maximum count and count rate problems are addressed by a "digit counter" implemented in a non-volatile memory device. The count value of a digit counter is indicated by a plurality of digits, with each digit having a number of bits equal to the base of the digit minus 1. For example, the ten symbols of a base$_{10}$ digit may be represented by nine bits as follows:

| Symbol | Digit |
| --- | --- |
| 0 | 111111111 |
| 1 | 111111110 |
| 2 | 111111100 |
| 3 | 111111000 |
| 4 | 111110000 |
| 5 | 111100000 |
| 6 | 111000000 |
| 7 | 110000000 |
| 8 | 100000000 |
| 9 | 000000000 |

A significant benefit of this arrangement is that each of the N symbols of a base$_N$ digit may be represented by incrementally changing only one bit of the N−1 bits of the digit. In the context of a non-volatile memory device, this means that only one erase cycle need be performed every N counts (i.e., to wrap around from all zeros to all ones). This is in contrast to a typical binary counter in which an erase cycle must be performed every other cycle. Because there are fewer time consuming erase cycles, a higher average count rate and a higher count limit can be achieved.

FIG. 2 illustrates an exemplary digit counter 22 that includes N base$_{10}$ digits. Because an erase cycle (i.e., restoring bits from 0 to 1) is required only every 10$^{th}$ count, as opposed to every second count in a standard binary counter, the average count rate achievable in the digit counter 22 is approximately five times that of a standard binary counter. Similarly, because a program/erase cycle occurs only once every 10$^{th}$ count, as opposed to once every other count in a standard binary counter, the maximum count limit of the digit counter 22 is approximately five times that of a standard binary counter.

Generalizing from the digit counter 22 illustrated in FIG. 2, an erase cycle is required as frequently as the least significant digit of the count must be rolled over. Roll over of the least significant digit, on the other hand, is a function of the base of the digit. Combining these two concepts yields that the erase cycle frequency in a digit counter is inversely related to the base of the least significant digit—by increasing the base, M, of the least significant digit, the erase cycle frequency is reduced. This result is exploited to advantage in a preferred embodiment of a digit counter by having a least significant digit with a relatively large base and higher order digits with relatively small bases. The bases of the higher order digits do not influence the erase cycle frequency in the same way as the least significant digit and thus can be made smaller to save storage (recall that the number of bits required to represent the digit is determined by the base of the digit). In an alternate embodiment, however, the bases of the higher order digits may also be made large.

Figure 3:
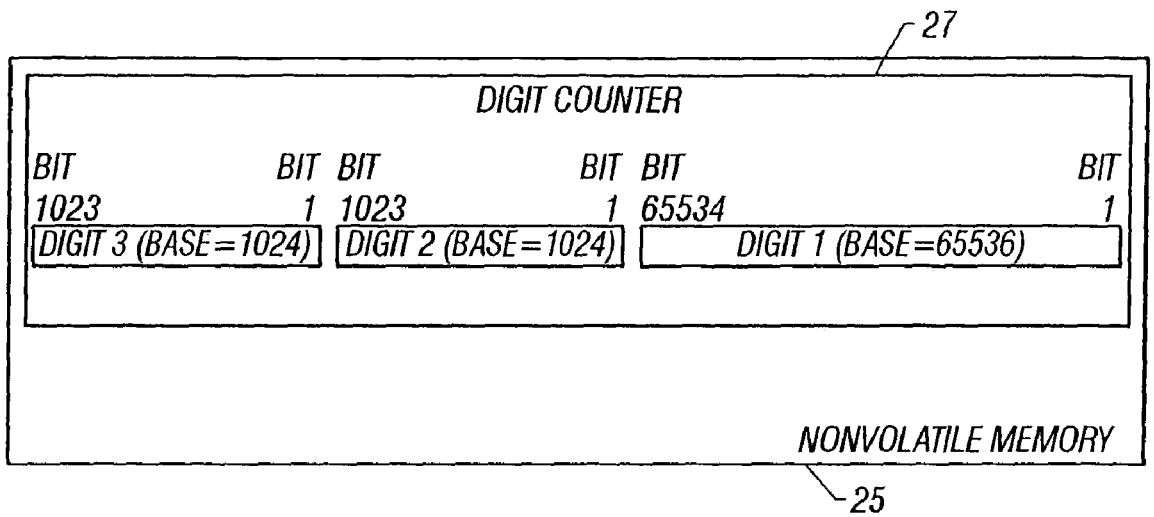
FIG. 3 illustrates a nonvolatile memory device in which a digit counter having nor-uniform digit bases has been implemented according to one embodiment.

FIG. 3 illustrates a nonvolatile memory device 25 in which a digit counter 27 having non-uniform digit bases has been implemented according to one embodiment. The least significant digit, DIGIT1, has a relatively large base (base=65536), while the more significant digits, DIGIT2 and DIGIT3, have somewhat smaller bases (base=1024). Because of the large base of the least significant digit, the maximum average count rate of the digit counter 27 is significantly faster than a binary counter that requires an erasure cycle every other count (i.e., approximately 65536/2 times as fast) and the number of program/erase cycles required to reach a given count is similarly reduced. The maximum count value that can be reached by the digit counter is the product of the bases of its three digits (65536*1024*1024=6.87*10$^{10}$), which is adequate for a broad range of counting applications. Of course, because of its larger base, DIGIT1 consumes more memory (8 kilobytes) than DIGIT2 and DIGIT3 (128 bytes each), but such storage requirements can be accommodated by many commercially available nonvolatile memory devices (e.g., flash EPROM and other forms of programmable non-volatile memory). Also, to ensure monotonic operation of the digit counter, storage for the most significant digit, DIGIT3, may be implemented in memory cells that cannot be erased (e.g., one-time program (OTP) memory) to prevent the digit counter from wrapping around. Additional circuitry may also be provided to prevent wrap around of lower order digits after the maximum count has been reached. Alternatively, wrap prevention of lower order digits after reaching the maximum count may be implemented in system software. For example, kernel level software may be executed to command the incrementing of the non-volatile digit counter so that, upon detecting that the maximum count has been reached, increment commands are no longer issued. Note that there may be more or fewer digits in a digit counter according to an alternate embodiment. Also, the values of the digit bases shown in FIG. 3 are examples only. Digits having larger or smaller bases may be used in alternate embodiments.

In one embodiment, the base of the least significant digit is selected according to a maximum count and a minimum average count rate specified for a given application. In essence, the base of the least significant digit is made large enough to meet the minimum average count rate and also to ensure that the number of program/erase cycles required to reach the maximum count will not exceed the maximum number of program/erase cycles specified for the non-volatile memory device in which the digit counter is to be implemented. More specifically, assume that a given average count rate, R counts/sec, is required in a counter application. Then, the minimum digit base for achieving the average count rate may be determined by the following equation:

Min Digit1 Base=(Erase Time−Program Time)/((1/R−Program Time)

For example, assume that a minimum average count rate of 1000 counts per second is required, that the erase time of the nonvolatile memory device is 1 second and that the program time is 10 microseconds. Then the minimum base of the least significant digit that could support the count rate is (1−1E−5)/(1E−3−1E−5)=1010.1, which rounds up to 1011.

The relation of the maximum count to the number of program/erase cycles of the implementing nonvolatile memory device may also dictate the minimum base of the least significant digit. As discussed above, the maximum number of counts that be provided by a digit counter is equal to the product of the bases of the counter's digits (or, more precisely, the product less 1). Because the least significant digit will be erased once for each increment (including rollover) of the next to least significant digit, the number of erase cycles required to reach the counter's maximum count is equal to the maximum count of the digit counter divided by the base of the least significant digit (i.e., product of bases of all digits except the least significant digit). For example, suppose that the 1000 count-per-second counter application requires a maximum count of 20 billion (2E10), and that the nonvolatile device in which the counter is to be implemented permits a maximum of 100,000 erase cycles. In this case, the next to least significant digit can be incremented (including rollover) no more than 100,000 times in order to reach the maximum count of 20 billion. Otherwise the maximum erase cycle specification of the nonvolatile memory device will be exceeded. Accordingly, the base of the counter must be at least 20 billion/100,000=200,000, or approximately 25 kilobytes in size. Thus, in this case, the maximum count required by the application and erase cycle limitations in the implementing nonvolatile device determine the base of the least significant digit, not the count rate. To complete the example, five base 10 digits may be used to implement the most significant digits of the counter.

To summarize, the digit counter may be implemented with various base sizes in order to accommodate the minimum count rate and maximum count required by different applications and to accommodate the various maximum erase cycle specifications and size constraints of different non-volatile memory devices. Thus, the use of non-uniform base sizes permits the digit counter to be adapted for use in numerous different applications and in nonvolatile memory devices having various sizes and erase cycle maximums.

Figure 4:
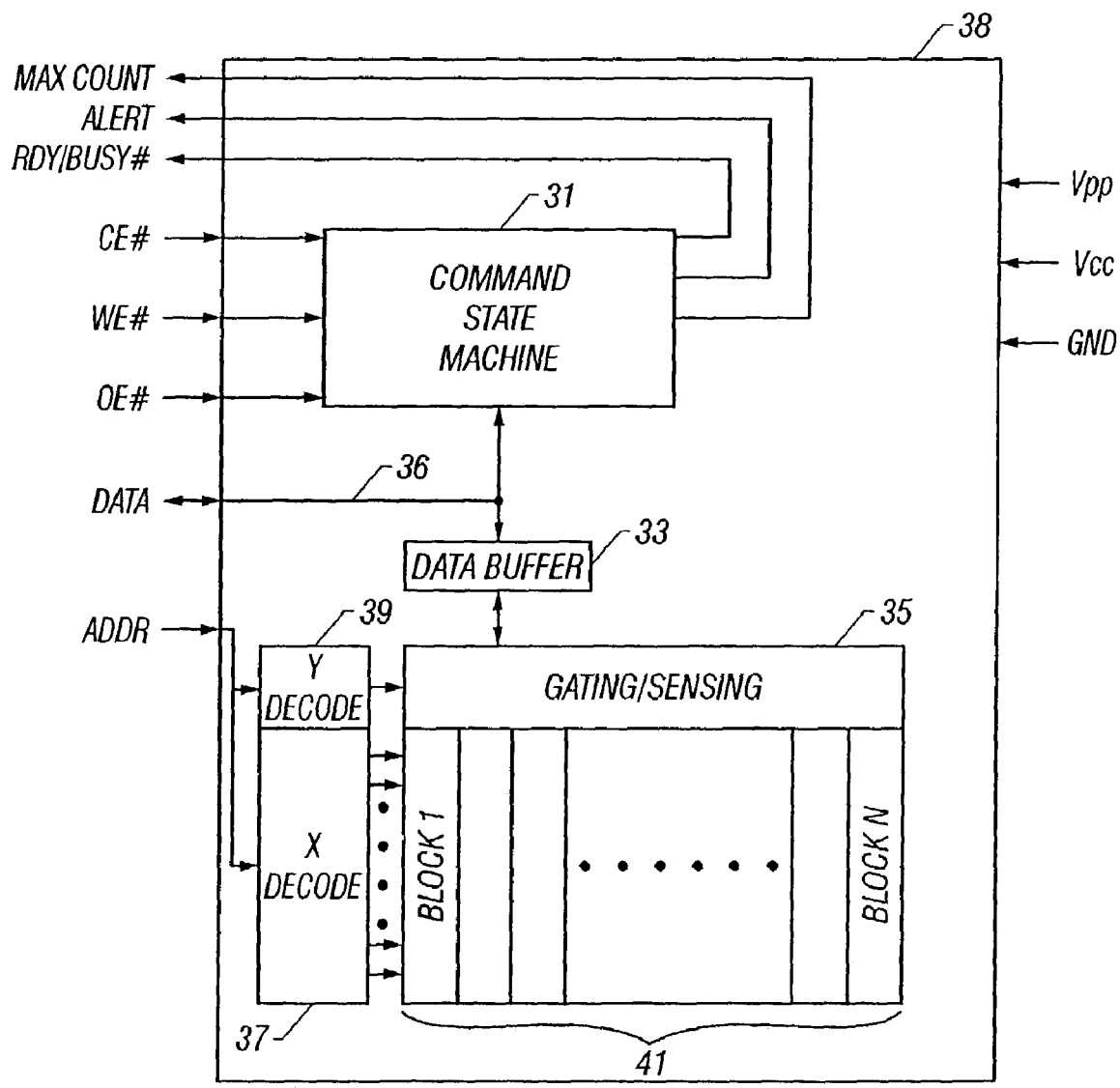
FIG. 4 illustrates further details of the nonvolatile memory device of FIG. 3 according to one embodiment.

FIG. 4 illustrates further details of the nonvolatile memory device 25 of FIG. 3 according to one embodiment. Preferably, the nonvolatile memory device 25 is a flash EPROM that includes a flash cell array 41 arranged in discrete blocks. Other types of nonvolatile storage may be used in alternate embodiments.

In one embodiment, the nonvolatile memory device 25 includes a command state machine 31 to receive chip enable (CE#), write enable (WE#) and output enable (OE#) signals from a host device such as a microprocessor, microcontroller, digital signal processor or application-specific processing unit. The command state machine 31 also receives a data input (DATA) either from an internal data buffer 33 or from a bi-directional datapath 36 coupled to the host device. Incoming data is buffered by the data buffer 33 before being written to an addressable set of storage cells (forming a storage word) in the flash cell array 41. The most significant bits of an incoming address (ADDR) are decoded by a Y-decoder 39 to select a block of storage cells to be written to, while lower order bits of the incoming address are decoded by an X-decoder 37 to select a storage word within the selected block. Gating/sensing circuitry 35 enables access the block selected by the Y-decoder output. Once the storage word is selected by the X and Y decoders (37, 39), data is transferred to the storage word from the data buffer 33. In a read operation, the X and Y decoders (37, 39) are used to select a storage word based on an incoming address as described above, then sensing amplifiers within the gating/sensing circuitry 35 are used to sense the stored word and pass the word to the data buffer 33 for eventual output onto the datapath 36. The nonvolatile memory device receives a programming voltage (Vpp), a supply voltage (Vcc) and a ground reference (GND) from off-chip sources. In an alternative embodiment, the programming voltage may be generated by a charge pump included in the nonvolatile memory device. Also, the command state machine 31 outputs a ready signal (RDY/BSY#), an alert signal (ALERT) and a maximum count signal (MAX COUNT). The ready signal is used to indicate whether the nonvolatile device 25 is available to carry out host-requested operations and is typically deasserted, for example, during program and erase operations. The alert and max count signals are optionally provided to indicate illegal counter-related requests and to indicate when the digit counter has reached a maximum count.

In one embodiment, the command state machine 31 implements a multiple-bus cycle command structure in which the first bus cycle is used to receive a command from the host and subsequent bus cycles are used to transfer operands, if any, associated with the command. An exemplary, though not exhaustive, list of commands supported by the command state machine 31 is shown in FIG. 5. As shown, a write operation during a first bus cycle indicates a new command according to the data associated with the write operation (i.e., FF hex indicates a read operation, 90 hex indicates a status read, 50 hex is a command to clear the status, 40 hex is a command to program a storage word, 20 hex is a command to erase a block in the array, C0 hex is a counter increment command, and 60 hex is a command to setup the counter). As shown, the read array and program operations involve reading, and writing data from an array address during a second bus cycle. Similarly, the read status command involves reading a status register during a second bus cycle and the block erase command involves erasing a block of the flash array.

An increment command 61 and counter setup command 62 are provided to support nonvolatile counter operation. In one embodiment, when an increment command 61 is received, a counter that is implemented in one or more of the blocks of the flash array is incremented and the resulting count is automatically returned to the host. In one implementation, the count value is returned to the host with the value of each digit represented by a binary value (e.g., a $base_{65536}$ digit is represented by a 16-bit binary number, a $base_{1024}$ digit is represented by a 10-bit binary value, and so forth). In an alternate implementations, a pure binary value (i.e., no separate representation of digits) is returned to the host or the raw bit patterns of the digits themselves may be returned. In one embodiment, circuitry within the gating/sensing logic 35 is used to generate the binary representation of the digits (or of the entire number) returned to the host. In an alternate embodiment, logic within the command state machine is used to record the count value and is updated with each increment command. When power is cycled, the command state machine reads the individual digits of the counter to recover the count at which power down occurred. The command state machine may record the count value as a binary number representation of the entire number or as a binary representation of the individual digits. Also, though not shown in FIG. 5, a separate counter read command may also be provided to read the counter. In that case, the count value need not be automatically returned in response to the increment command. Instead, the count may be read by the host when desired (e.g., under program control).

In one embodiment, the counter setup command 62 is used to establish the size of each digit of the digit counter. For example, the second bus cycle of the counter setup operation specifies the number of bits in the first digit, the third bus cycle specifies the number of bits in the second digit and so forth. In one embodiment, the block address of the first block allocated to a given digit is specified in each digit setup bus cycle (i.e., in each of the second through Nth bus cycles of the counter setup command 62) so that the block in which different digits of the counter are maintained may be specified by the host. This allows the digits to be scrambled. Also, the digit base may be specified by the value transferred on the datapath (i.e., element 36 of FIG. 4) during the digit setup bus cycle (i.e., the "DB" value in the DATA column of command 62) so that less than all the bits of a given block need be allocated to the digit. For example, a digit setup bus cycle in which BA=block 1 and DB=1024, indicates that the first 1024 bits of block 1 are to be reserved for a digit of the counter. In one implementation, if DB exceeds the number of bits of a block (e.g., block size 65536 bits and DB=100,000), then bits in the subsequent block are automatically allocated to the digit.

In one embodiment, a region of the flash array (e.g., in block N) is used to record the digit setup information so that, upon power cycling, the structure of the digit counter is recovered. The command state machine 31 reads the digit setup information on power up and records the boundaries of the digits. Any commands other than legitimate counter operations (e.g., increment command and, if implemented, read count command) are screened to ensure that they do not affect the digits of the digit counter. For example, the command state machine 31 may compare incoming addresses associated with read, program, erase and other non-counter operations to determine whether the addresses fall within an address range (or ranges) allocated to the digit counter. If so, the operation is disallowed and, optionally, a security alert signal (e.g., the ALERT signal discussed above) is generated to allow host processes to record the error and take appropriate action. In one embodiment, the setup information for the digits is recorded in a one-time programmable (OTP) space of the flash array so that it cannot be altered after initial configuration. By this arrangement, the nonvolatile memory device may be configured to support numerous different secure counting applications either at time of fabrication/installation or during to end-user setup. Circuitry for preventing wrap of the digit counter after the maximum count has been reached may also be included in the command state machine 31. Also, the command state machine 31 may include circuitry to assert the MAX COUNT signal when the maximum count is reached.

Figure 6:
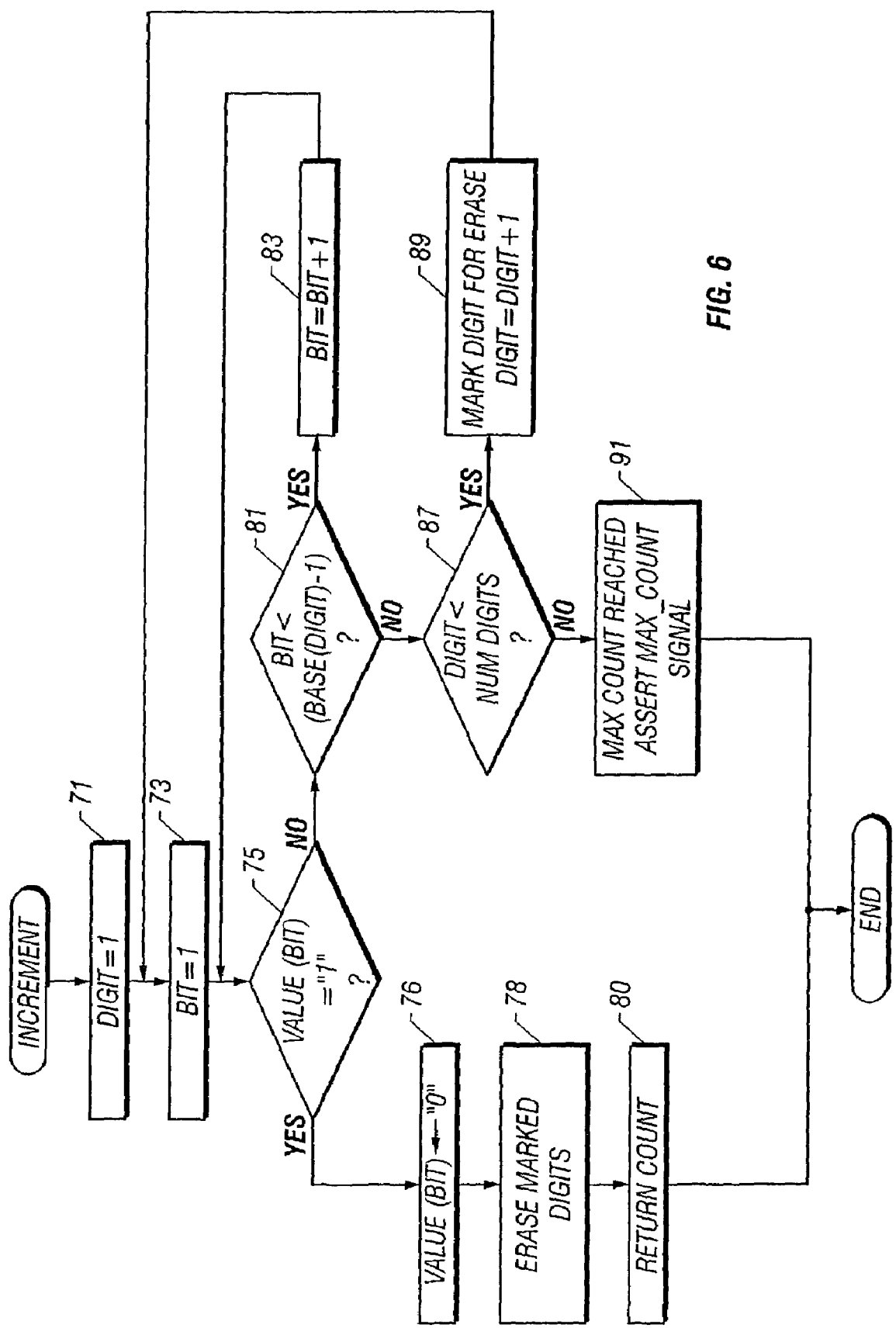
FIG. 6 is a flow diagram of an increment operation performed by a command state machine in a nonvolatile memory device according to one embodiment.

FIG. 6 is a flow diagram of an increment operation performed by the command state machine 31 of FIG. 4 according to on embodiment. Initially, a digit pointer (DIGIT) indicative of the digit to be operated upon is initialized to 1 at block 71. At block 73, a bit pointer (BIT) is also initialized to 1. At decision block 75, the value of the bit indicated by the bit pointer is evaluated to determine if it is erased ("1") or programmed ("0"). If erased, then the bit is programmed to a "0" at block 76, effectively incrementing the counter. At block 78, digits marked for erasure are erased. The purpose of this operation is made clear below. At block 80, the count value of the digit counter is returned. As discussed above, the count may be read anew from the nonvolatile storage in response to each increment command, or the command state machine may track the number of increments to the count value since the last power up cycle.

If, at block 75, the value of the bit indicated by the bit pointer is "0," then the next bit of the digit counter will be checked. Thus, at decision block 81, the bit pointer is compared against the base of the digit indicated by the digit pointer. If the bit pointer is less than the base minus 1, then the bit pointer can be incremented at block 83 without indexing past the end of the digit. If the bit pointer is not less than the base minus 1, then all the bits of the digit have been evaluated (and found to be zero) and the digit pointer (DIGIT) is to be incremented. Accordingly, at decision block 87, the digit pointer is compared with the number of digits in the digit counter (NUM DIGITS). If the digit pointer is less than NUM DIGITS minus 1, then the digit pointer can be incremented without indexing past the number of digits in the digit counter. Thus, at block 89, the bits of the digit indicated by the digit pointer are marked for erasure erased and the digit pointer is incremented to indicate the next digit of the digit counter. By marking the digit for erasure, rollover of the digit is eventually accomplished in block 78 after a higher order digit is incremented in block 76. After block 89, processing begins again at block 73, to reinitialize the bit pointer for the newly selected digit to 1.

If, at decision block 87, the value of the digit pointer is not less than NUM DIGITS minus 1, then the maximum count has been reached and no further incrementing of the counter is permitted. If the nonvolatile memory device includes a maximum count output, a maximum count signal is asserted at block 89. Note, that the RDY/BSY or alert outputs may alternatively be used to transmit the maximum count signal.

If the maximum count of the counter has not been reached, then eventually an erased bit will be detected in one of the digits of the digit counter (i.e., at block 75). After the bit is programmed at block 76, all digits marked for erasure are erased simultaneously (or at least near in time) in block 78. By this design, all digits to be rolled over in a given count increment are rolled over at the same time (or at least nearly so). Consequently, cumulative erase times are avoided, and delay between the program and erase operations is reduced, making the digit counter less susceptible to corruption arising from power down in the middle of an increment operation.

In one embodiment of the present invention, a processor connected to a monotonic counter, such as processor 102 or security co-processor 110 in FIG. 1, can be programmed to automatically configure the above-described digit counter based on user-provided application requirements and non-volatile memory device specifications. The processor calculates an appropriate number of digits and an appropriate base for each digit based on input maximum count and minimum count rate requirements, and based on timing and erase cycle maximum characteristics of the nonvolatile memory device used to implement the counter.

The implementation of the non-uniform base digit counter as a non-volatile, monotonic counter ensures that the counter is impervious to power failures that otherwise might cause a loss of count. The digit counter is preferably implemented such that higher order digit incrementing occurs before lower order digit erase, and that the operation completes before the count value is returned. If a count increment operation is interrupted (such as due to a power failure), the lower order digits may not be fully at a zero state. However, any intermediate state can be interpreted as being greater than zero, hence a logic one. Thus, the last state of the counter can be effectively recovered.

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly to be regarded in an illustrative rather than a restrictive sense.

What is claimed is:

1. A computer system comprising:
    a bus;
    a processor coupled to the bus;
    a nonvolatile memory device coupled to the bus to receive commands from the processor, the commands including an increment command, the non volatile memory device including:
        a nonvolatile storage array organized in digits having non-uniform bases and a respective number of bits according to its base minus one; and
        circuitry to increment a count value represented by the digits in response to the increment command.

2. The computer system of claim 1 wherein the nonvolatile storage includes a plurality of blocks of storage cells, each of the digits being stored in a respective one of the blocks.

3. The computer system of claim 2 wherein one of the digits spans two or more of the blocks.

4. The computer system of claim 2 wherein the nonvolatile storage is a flash erasable programmable read only memory in which a selected block of the plurality of blocks is erased in response to an erase command that identifies the selected block.

5. The computer system of claim 1 wherein the circuitry to increment the count value comprises circuitry to increment one digit of the digits by programming only one bit of the digit.

6. The computer system of claim 5 wherein the circuitry to increment the one digit of the digits comprises circuitry to evaluate bits of the one digit to identify a least significant bit of the one digit that is in an erased state, the least significant bit being the only one bit programmed to increment the one digit.

7. The computer system of claim 1 wherein the circuitry includes circuitry to increment one of the digits and to erase each of the digits less significant than the one of the digits.

8. The computer system of claim 7 wherein the circuitry to erase each of the digits less significant than the one of the digits comprises circuitry to concurrently erase each of the digits less significant than the one of the digits.

9. The computer system of claim 1 further comprising:
    program circuitry to write data to the nonvolatile storage in response to program commands received from an external source; and
    circuitry to detect whether an address specified by one of the program commands falls within a range of the nonvolatile storage allocated to the digits and, if so, to disallow the program circuitry from writing data at the address.

10. The computer system of claim 9 further comprising circuitry to output the count value represented by the digits in response to the increment command.

11. The computer system of claim 9 further comprising circuitry to output the count value represented by the digits in response to a read command.

12. The computer system of claim 9 further comprising circuitry to generate a binary representation of the count value for output to the processor.

13. The computer system of claim 12 wherein the circuitry to generate a binary representation of the count value is configured to generate a distinct binary representation of the value of each of the digits.

14. A computer system comprising:
    a bus;
    a processor coupled to the bus;
    a security co-processor coupled to the bus to receive commands and data from the processor; and
    a nonvolatile memory device coupled to receive commands from the security co-processor, the commands including an increment command, the nonvolatile memory device including a nonvolatile storage array organized in digits having non-uniform bases and a respective number of bits according to its base minus one; and
        circuitry to increment a count value represented by the digits in response to the increment command.

15. A method comprising:
    receiving a command to increment a counter implemented in a nonvolatile storage device, the nonvolatile storage device including a nonvolatile storage array organized in digits that have non-uniform bases, the digits defining the counter;
    searching each of the digits in order of significance until a least significant unprogrammed bit of one of the digits is found; and
    programming the unprogrammed bit to carry out the increment command.

16. The method of claim 15 further comprising erasing bits of each of the digits less significant than the one of the digits containing the unprogrammed bit to carryout the increment command.

17. The method of claim 15 further comprising receiving a command specifying a base for each of the digits of the counter.

18. The method of claim 15 further comprising receiving a command specifying a quantity of the digits.

* * * * *